(12) United States Patent
Seong et al.

(10) Patent No.: US 9,531,404 B2
(45) Date of Patent: Dec. 27, 2016

(54) COMPUTER INPUT DEVICE AND METHOD OF USING THE SAME

(71) Applicant: Samsung Electronics Co., Ltd., Gyeonggi-do (KR)

(72) Inventors: Sangmin Seong, Gyeonggi-do (KR); Namil Kim, Gyeonggi-do (KR); Sunghan Kim, Gyeonggi-do (KR); Seokbaek Lee, Gyeonggi-do (KR); Sungchul Chun, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/280,058

(22) Filed: May 16, 2014

(65) Prior Publication Data

US 2014/0340305 A1    Nov. 20, 2014

(30) Foreign Application Priority Data

May 16, 2013 (KR) .......................... 10-2013-0056060

(51) Int. Cl.
  *G06F 3/01* (2006.01)
  *G06F 3/023* (2006.01)
  *H03M 7/40* (2006.01)
  *G06F 3/033* (2013.01)

(52) U.S. Cl.
  CPC ................ *H03M 7/40* (2013.01); *G06F 3/013* (2013.01); *H03M 7/4025* (2013.01)

(58) Field of Classification Search
  CPC ........ G06F 3/011; G06F 3/0233; G06F 3/033; G06F 3/013; H03M 7/40; H03M 7/4025
  See application file for complete search history.

(56) References Cited

U.S. PATENT DOCUMENTS

| | | | |
|---|---|---|---|
| 7,488,294 B2* | 2/2009 | Torch | 600/558 |
| 7,889,244 B2* | 2/2011 | Tsukizawa | G06F 3/012 348/222.1 |
| 2005/0007552 A1* | 1/2005 | Fergason et al. | 351/210 |
| 2012/0256836 A1* | 10/2012 | Rudinsky | 345/163 |
| 2013/0265232 A1* | 10/2013 | Yun | G09G 3/3208 345/158 |
| 2014/0055342 A1* | 2/2014 | Kamimura | G06F 3/013 345/156 |

* cited by examiner

*Primary Examiner* — Andrew Sasinowski
(74) *Attorney, Agent, or Firm* — The Farrell Law Firm, P.C.

(57) ABSTRACT

An auxiliary input device for use in inputting a user signal to a computer is provided. The computer auxiliary input device includes an infrared ray transmitter configured to transmit an infrared ray signal to a left eyeball and a right eyeball of a user. A reflected light sensor configured to measure a change in an amount of light reflected from the left eyeball and the right eyeball. A controller configured to detect the change in the amount of light reflected from each of the eyeballs from the reflected light sensor, generate Morse code alphabets based on the detected change, and convert the Morse code alphabets into a character string to be transmitted to the computer. A computer communication unit is configured to provide the character string converted by the controller to the computer.

4 Claims, 13 Drawing Sheets

COMPUTER INPUT DEVICE AND METHOD OF USING THE SAME

PRIORITY

This application claims priority under 35 U.S.C. §119(a) to Korean Patent Application No. 10-2013-0056060, which was filed in the Korean Intellectual Property Office on May 16, 2013, the entire disclosure of which is incorporated herein by reference.

BACKGROUND OF THE INVENTION

1. Field of the Invention

The present invention relates generally to a computer input device and method of using the same, and more particularly, to a computer input device for disabled persons.

2. Description of the Prior Art

Since the information age began, the level of information capable of being obtained has increased and the information is continuously developed. As a result, while most persons may easily access and store information, those with disabilities may still have difficulty in this. For example, certain disabilities may prevent a person from properly using a computer and this may be a severe hindrance for those with such disabilities.

While auxiliary devices exist that allow disabled persons to use computers, costs of such devices are high.

Currently, the number of persons with disabilities accounts for about 15% of the general population of the world and is increasing every year.

Nowadays, solutions and auxiliary devices for computer use by disabled persons are continuously presented but not yet perfect. In addition, commercial Personal Computer (PC) auxiliary devices for disabled persons are not easily obtainable due to the high prices thereof. Further, methods of controlling the PC auxiliary devices are not easy. In addition, because most PC auxiliary devices provide only a virtual mouse, there is an inconvenience in that typing is difficult and the virtual mouse should be operated many times in order to complete one sentence.

SUMMARY OF THE INVENTION

The present invention is designed to address at least the problems and/or disadvantages described above and to provide at least the advantages described below.

Accordingly, an embodiment the present invention provides an inexpensive computer auxiliary device (hereinafter, simply referred to as "auxiliary device") for disabled persons and a method of driving the same.

In addition, an embodiment of the present invention provides an auxiliary device for disabled persons which provides both of a virtual keyboard and a virtual mouse and a method of driving the same.

Further, an embodiment of the present invention provides an auxiliary device for disabled persons which may be easily controlled and a method of driving the same.

According to an embodiment of the present invention, an auxiliary input device is provided for use in inputting a user signal to a computer. The auxiliary input device includes an infrared ray transmitter configured to transmit an infrared ray signal to a left eyeball and a right eyeball; a reflected light sensor configured to measure a change in an amount of light reflected from the left eyeball and the right eyeball of a user; a controller configured to detect the change in the amount of light reflected from each of the eyeballs from the reflected light sensor, generate Morse code alphabets based on the detected change, and convert the Morse code alphabets into a character string to be transmitted to the computer; and a computer communication unit configured to provide the character string converted by the controller to the computer.

According to an embodiment of the present invention, an auxiliary input device is provided for use in inputting a user signal to a computer. The auxiliary input device includes switches configured to provide two different key inputs; a controller configured to converts the key inputs into Morse code alphabets which are long and short signals, and converts the Morse code alphabets into a character string to be transmitted to the computer; and a computer communication unit configured to provide the character string converted by the controller to the computer.

According to another embodiment of the present invention, a computer input system is provided, which includes a computer configured to receive Morse code alphabets corresponding to a keyboard input and a mouse input from an auxiliary input device as a user input signal based on a predetermined communication method; and the auxiliary input device configured to transmit the user input signal to the computer. The auxiliary input device includes an infrared ray transmitter configured to transmit an infrared ray signal to a left eyeball and a right eyeball of a user; a reflected light sensor configured to measure a change in an amount of light reflected from the left eyeball and the right eyeball; a controller configured to detect the change in the amount of light reflected from each of the eyeballs from the reflected light sensor, generate Morse code alphabets based on the detected change, and convert the Morse code alphabets into a character string to be transmitted to the computer; and a computer communication unit configured to provide the character string converted by the controller to the computer.

According to an embodiment of the present invention, a computer input system is provided, which includes a computer configured to receive Morse code alphabets corresponding to a keyboard input and a mouse input from an auxiliary input device as a user input signal based on a predetermined communication method; and the auxiliary input device configured to transmit the user input signal to the computer, wherein the auxiliary input device includes: switches configured to provide two different key inputs; a controller configured to convert the key inputs into Morse code alphabets which are long and short signals, and convert the Morse code alphabets into a character string to be transmitted to the computer; and a computer communication unit configured to provide the character string converted by the controller to the computer.

According to still another embodiment of the present invention, a method is provided for receiving a user input from auxiliary input device and processing the user input. The method includes converting, by the auxiliary input device, two different inputs into Morse code alphabets which are long and short signals; converting, by the auxiliary input device, the Morse code alphabets into a character string to be transmitted to the computer; interpreting, by the computer, the received character string as a command previously stored to correspond to the Morse code alphabets; and driving the computer in response the command interpreted by the computer.

When an auxiliary device for disabled people and a method of driving the same according to the present invention are applied, a virtual keyboard and a virtual mouse may be provided simultaneously and easily controlled by a disabled person. Further, an apparatus to which an auxiliary device for a disabled person and a method of driving the same according to the present invention are applied may be manufactured at low costs and, thus, may be provided to a disabled person at low prices.

BRIEF DESCRIPTION OF THE DRAWINGS

The above and other aspects, features, and advantages of certain embodiments of the present invention will be more apparent from the following detailed description taken in conjunction with the accompanying drawings, in which.

DETAILED DESCRIPTION OF THE EMBODIMENTS OF THE PRESENT INVENTION

Figure 1:
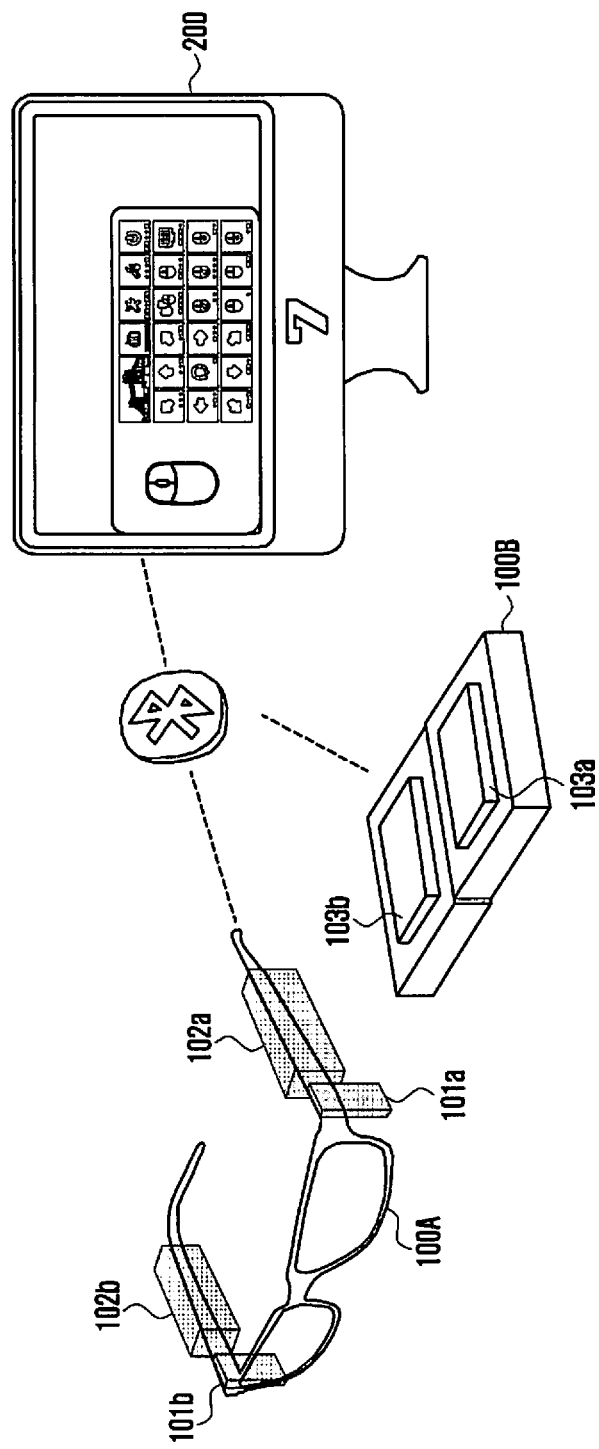
FIG. 1 is a diagram illustrating a configuration of a system between a computer and auxiliary input devices through which a disabled person as a user inputs a user input to the computer, according to an embodiment of the present invention.

Hereinafter, various embodiments of the present invention will be described with reference to accompanying drawings. It shall be noted that the accompanying drawings of the present invention are provided so as to help the understanding of the present invention and the present invention is not limited to the shapes and arrangements illustrated in the drawings. In addition, equivalents or extensions to additional embodiments of the present invention illustrated in the accompanying drawings may be appreciated through the descriptions made with reference to the drawings.

FIG. 1 illustrates a configuration of a system between a computer 200 and auxiliary input devices 100A and 100B through which a disabled person as a user provides a user input to the computer 200, according to an embodiment of the present invention.

Each of auxiliary input devices 100A and 100B according to the present invention is illustrated in a form capable of conducting data communication with the computer 200 through Bluetooth communication (or other wireless communication standard). However, the auxiliary input devices 100A and 100B may conduct data communication with the computer 200 through a wire or other suitable medium, e.g., fiber optic cable.

The auxiliary input devices 100A and 100B illustrated in FIG. 1 are not both required and only one of the eyeglass-type auxiliary input device 100A and the switch-type auxiliary input device 100B may be provided. In the following description, the eyeglass-type auxiliary input device 100A will be mainly described and for the switch-type auxiliary input device 100B, descriptions will be made only when a configuration or operation is varied.

The eyeglass-type auxiliary input device 100A includes a sensor and an infrared ray transmitter at each temple. Each transmitter includes a sensor that irradiates an infrared ray signal to an eye and receives an infrared ray signal reflected according to a movement of an eyelid, i.e. eye blinking. The infrared ray sensors detect the movements of the left eyelid and the right eyelid, respectively, and convert left/right eye blinking into Morse code alphabets. In addition, since the sensors of the eyeglass-type auxiliary input device 100A are positioned at both sides to be spaced away from each other, each of the sensors of the eyeglass-type auxiliary input device 100A of the two sides may include a wireless communication module so as to inform of a detection of a movement of an eyelid therebetween or from one side to the other side. The wireless communication module is shown schematically as 102a, 102b in FIG. 1. When a wired data transmission line (not shown) is included through the inside of the temples of the eyeglasses, the wireless communication modules may not be provided at either side.

The eyeglass-type auxiliary input device 100A recognizes, codes, and transfers eye blinking to the computer. In order to recognize the eye blinking, the sensors are positioned around the eyes. Thus, required sensors and modules 102a, 102b are attached to the eyeglasses so as to catch the movements of eyelids. In addition, lenses for correcting eye sight may be used in the eyeglasses depending on a user's eyesight but are irrelevant to the operation of the sensors of the present invention.

The sensors are positioned preferably at the portions where the rim of left and right lenses and temples of the eyeglass-type auxiliary input device are joined to each other. One infrared ray emission LED and one sensor configured to detect a reflection quantity of infrared rays are paired with each other and one pair is installed at each of the left and right sides. Each pair of the emission LED and one sensor is shown schematically as 101a, 101b in FIG. 1. In addition, a battery and a circuit that drives a sensor may be preferably attached to an outer portion of a temple area of the eyeglass type auxiliary input device. Preferably, the form and the size of the battery and the circuit are made to be as small and light as possible. More preferably, the battery and the circuit are components of each module 102a, 102b disposed on the outer portion of either the left temple or the right temple of the eyeglass frame.

In addition, the configurations of the respective modules 102a, 102b, i.e. the left and right modules may not be equal to each other. One of the modules 102*a*, 102*b* may include, for example, a battery, a charging circuit, and a power supply circuit, and the other module may additionally include a circuit configured to drive an LED and process and transmit a value of the sensors to the computer. That is, the eyeglass-type auxiliary input device 100A may include a wireless module configured to transmit data to the computer 200 and may use a Bluetooth module as illustrated in the drawing.

In FIG. 1, due to the difference between the auxiliary input device 100A and the switch-type auxiliary input device 100B, the input methods thereof are different from each other. That is, when the user is a disabled person capable of moving at least one finger or performing a corresponding movement, the user may push each of the switches in the switch-type auxiliary input device 100B so as to input a signal in the same manner as the movement of an eyelid. At this time, the input manner is recognized as Morse code alphabets like the eyeglass-type auxiliary input device.

Now, the overall operations using the above-mentioned configuration will be described again. The present invention, which employs a method that detects two states of a human's eye being closed and eye blinking, recognizes a detected state as Morse code alphabets, and then transmits the Morse code alphabets to the computer, may provide an environment which allows other types of inputting to be performed similarly.

In a case of a disabled person who is capable of moving any portion of the body, an input of a binary signal which is the same as two eyes' blinking may be received when a button is pushed without the two eyes' blinking. Accordingly, unlike a sensor attached to the eyeglass-type auxiliary input device 100A and configured to use a reflected amount of infrared rays, a separate module configured to detect whether a button is pushed or not may be considered. This is illustrated as the switch-type auxiliary input device 100B in FIG. 1. The switch-type auxiliary input device 100B is configured as two modules 103*a*, 103*b* and the two modules 103*a*, 103*b* may be configured to have the same size and shape as illustrated in FIG. 1. Each of the two modules 103*a*, 103*b* may have a single switch (not explicitly shown). The two modules 103*a*, 103*b* of the switch-type auxiliary input device 100B are hardware devices which are completely independent from each other and may be configured to be separated from or attached to each other. Through this, the user may input binary codes using each of different body portions which are distant from each other. One of the two modules 103*a*, 103*b* may include a Bluetooth communication device (not shown) configured to communicate with the computer 200 and a Zig-bee module configured to communicate with the other module, and may be connected to the computer 200 via a wired interface when the one module is configured to be connected to the computer 200 via a wired interface. When only the wireless communication with the computer 200 is allowed, the one module includes a wireless communication unit configured to transmit data to the other module, for example, the Zig-bee module and the other module may include a wireless module configured to transfer the data to the computer 200.

Meanwhile, it is desirable to fabricate the modules 102*a*, 102*b* to be attached to the eyeglass frame of the eyeglass-type auxiliary input device 100A, to be small and light in consideration of the user's convenience. Accordingly, the circuits should be configured to be small and light through the fabrication of a PCB. When it is possible to insert some necessary parts, the eyeglass frame of the eyeglass-type auxiliary input device 100A may be configured to have a form to which the present invention may be applied when fabricating the eyeglass frame, if possible.

Figure 2:
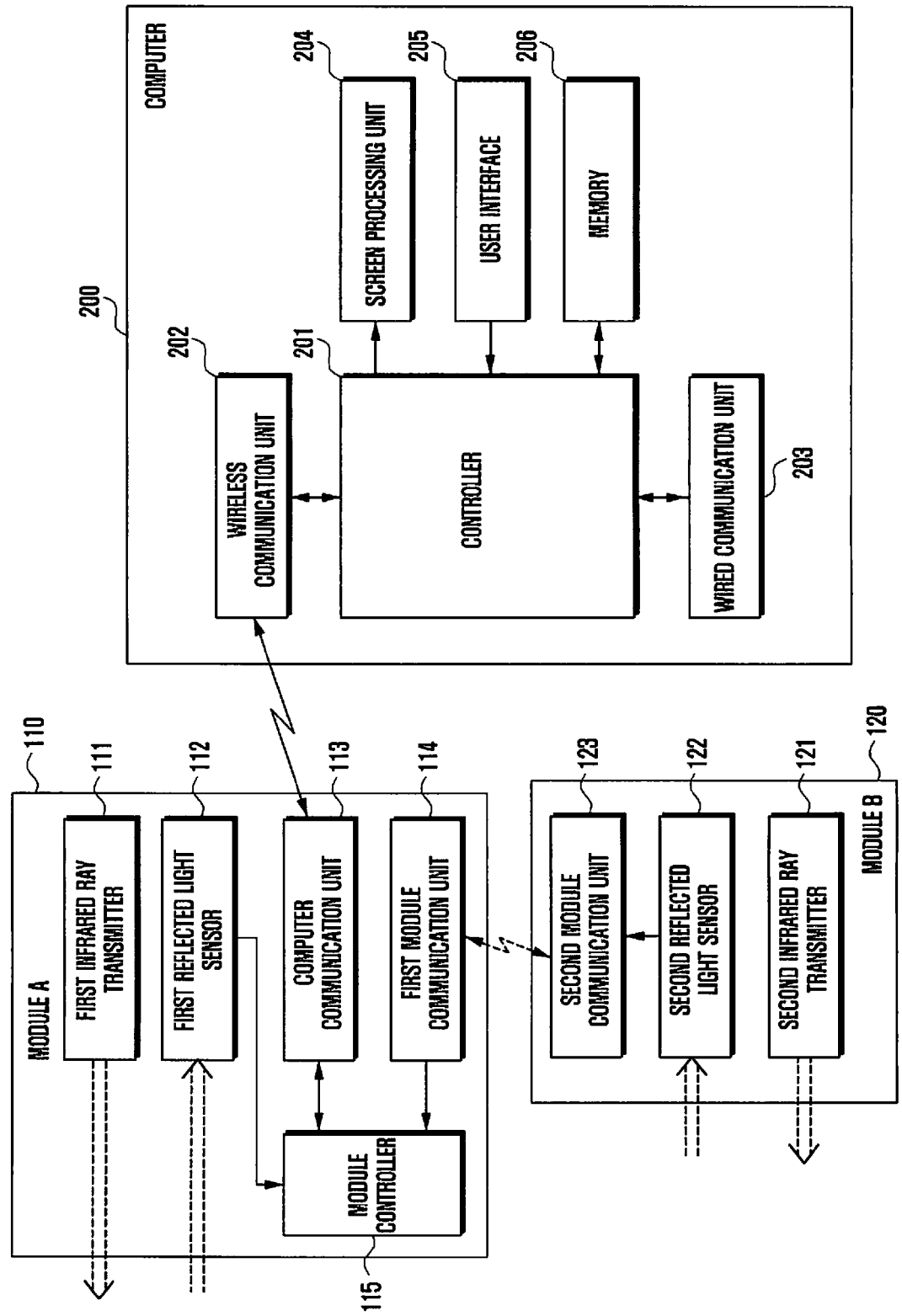
FIG. 2 is a block diagram of an auxiliary input device and a computer, according to an embodiment of the present invention.

FIG. 2 is a block diagram of an auxiliary input device and a computer, according to an embodiment of the present invention.

As illustrated in FIG. 1, the auxiliary input device is configured by two modules which form one pair. FIG. 2 illustrates that a module A 110 and a module B 120 form one pair and illustrates that communication with the computer 200 is executed through the module A 110.

Now, the configurations and operations of the module A 110 and the module B 120 will be described. The module A 110 may include a first infrared ray transmitter 111, a first reflected light sensor 112, a computer communication unit 113, a first module communication unit 114, and a module controller 115. The module B 120 may include a second infrared ray transmitter 121, a second reflected light sensor 122, and a second module communication unit 123.

The configuration and operation of the module B 120 will be described first. The second infrared ray transmitter 121 generates and transmits an infrared ray signal of a predetermined frequency band to an eyeball of a user. Here, the second infrared ray transmitter 121 is an element capable of generating heat in a human's body, e.g., the eyeball. Since the infrared ray transmitter should irradiate infrared rays to the eyeball, it is desirable to use a product of which the safety has been verified. According to materials investigated up to now, infrared rays having a high energy has an effect of being absorbed into and transferred to the tissues in the human body, thereby causing the tissues to generate heat. Using the effect, the infrared rays are also used for thermotherapy. However, upon being excessively exposed to infrared rays which have a high energy, the tissues in the human body may be destroyed by heat. Accordingly, it is very important to adjust an infrared ray transmitter, which is to be used in accordance with an embodiment of the present invention, to have an output value that may not transfer heat energy to an eyeball.

A signal transmitted from the second infrared ray transmitter 121 suffers from a change in reflected amount to be reflected to the second reflected light sensor 122 by a blinking action of an eyelid. Accordingly, the second reflected light sensor 122 may detect the amount of reflected light so as to detect the eye blinking. A signal output from the second reflected light sensor 122 is an analog signal. Accordingly, the second module communication unit 123 filters the signal input from the second reflected light sensor 122 to remove noise, then amplifies the signal by a predetermined amplification value, and converts the signal into a digital signal. The second module communication unit 123 transmits the digital signal obtained by detecting the movement of the eyelid using the reflected light to the module A 110 using a pre-set communication method. As the pre-set communication method, various methods may be used. In a case when the eyeglass frame is fabricated to be capable of performing wired communication in advance, data may be transmitted via a wire provided through the inside of the eyeglass frame. However, when the eyeglass frame is fabricated not to be capable of performing wired communication, a wireless method using wireless communication within a very short distance such as a Zig-bee method may be used. Through this, it is possible to reduce the weight of the eyeglass frame due to a battery while reducing power consumption.

In the foregoing, it has been described that the second reflected light sensor 122 performs only an operation of detecting a change in light amount of reflected light. However, as desired, the second reflected light sensor 122 may be configured to conduct filtering and analog-to-digital converting of sensed data. When the second reflected light sensor 122 is configured so, the corresponding function may be omitted from the second module communication unit 123.

In addition, because the second reflected light sensor 122 detects the wearer's eye blinking as a change in analog voltage, a measured voltage range may be very variable depending on the wearer's body conditions, the wearer's use environment, etc. Accordingly, a process of correcting this is required at the initial operating step. When performing the correction at the initial operation step, it may be possible to obtain a maximum average value and a minimum average value of analog-digital-converted (ADC) input values for a predetermined length of time and to use the intermediate value thereof as a threshold. This is to accumulate all the data which may be sampled for a predetermined length of time T at the initial driving and use the top 10% of values similar to the maximum value and the bottom 10% of values similar to the minimum value to obtain a reference value. At this time, T shall be a length of time where eye blinking occurs naturally, e.g., two or three times. When the reference value is set through this method, it is possible to reduce malfunctions due to any external factors.

The first infrared ray transmitter 111 and the first reflected light sensor 112 in the module A 110 correspond to the second infrared ray transmitter 121 and the second reflected light sensor 122 of the module B 120 as described above, and perform the same operations as the second infrared ray transmitter 121 and the second reflected light sensor 122. However, the output of the first reflected light sensor 112 is input to the module controller 115. At this time, when a value output from the first reflected light sensor 112 is in the analog form as it was sensed, circuits for filtering, amplification and analog-to-digital conversion may be additionally included.

The first module communication unit 114 of the module A 110 is a module configured to communicate with the second module communication unit 123 of the module B 120 in a pre-set method. The first module communication unit 114 transmits data required for controlling the module controller 115 to the second module communication unit 123 and provides a signal received from the second module communication unit 123 to the module controller 115. Accordingly, the first module communication unit 114 and the second module communication unit 123 perform encoding and decoding operations and band-raising/lowering conversion operations for communicating in the pre-set method.

The computer communication unit 113 is a communication module configured to communicate with the computer 200 in a pre-set or different method. The eyeglass-type auxiliary input device 100A may use the Bluetooth communication method, and the switch-type auxiliary input device 100B may use the wired communication method or the Bluetooth communication method, as described above. Accordingly, when performing the wireless communication, the computer communication unit 113 performs the encoding and decoding operations and the band-raising/lowering conversion operations for communicating in the pre-set method.

The module controller 115 generates data in a Morse code form using eyelid blinking information detected in the module B 120 through the first module communication unit 114 and eyelid blinking information input from the first reflected light sensor 112 and determines whether the generated data is the existing Morse code alphabets. As a result of the determination, when it is determined that the generated data is previously registered Morse code alphabets, the module controller 115 controls the computer communication unit 113 to send the corresponding Morse code alphabets to the computer 200.

Meanwhile, because people usually blink their eyes naturally, an alternative processing method for natural eye blinking may be needed. The method may be generally classified into an active method and a passive method. The active method may cause a malfunction of a system and the passive method has a problem in that the user may be troubled. These problems may be solved by taking only one eye's blinking prior to inputting a command as a start signal considering that when eyes are blinked, i.e., both eyes are usually blinked simultaneously. The one single eye's blinking plays a role like a start bit in a communication packet and the eye blinking thereafter may be deemed and processed as intended eye blinking. Besides this method, a length of time for which the user closes eyes may be set, and two or more methods may be set such that the user may use the most convenient method.

Using a state change time point of eye blinking input after the start signal is input, when the state change time is recognized as complete Morse code alphabets through a process of comparing it with numbers of cases of previously stored Morse code combinations which were previously stored, the result may be transmitted to the computer to complete one inputting operation.

Next, the internal configuration and operation of the computer 200 will be described. The computer 200 may include a controller 201, a wireless communication unit 202, a wired communication unit 203, a screen processing unit 204, a user interface 205, and a memory 206.

The controller 201 may generally be a computer processor and conduct a control through a calculation, a comparison, etc. required for all the control actions of the computer. In addition, the controller 201 may receive a signal from the auxiliary input device according to the present invention as a user input and perform a screen output and control a calculation corresponding thereto.

The wireless communication unit 202 and the wired communication unit 203 may be configured as a single module, and the wireless communication unit 202 conducts wireless communication with other devices through a communication method such as Bluetooth or Wi-Fi. In addition, the wired communication unit 203 is connected to a network via a wired interface such as the Internet to conduct data communication.

The screen processing unit 204 converts data received from the controller 201 into graphic data that is output through a monitor (not illustrated). In some cases, the function of the screen processing unit 204 may be conducted by the controller 201.

The user interface 205 converts user input data received from various user input devices such as a keyboard, a mouse, and a joystick into a form to be capable of being processed by the controller 201 and provides the converted data to the controller 201.

The memory 206 is a storage medium, for example, in a form of a ROM, RAM and/or a hard disc capable of storing user data. The memory 206 may store an operation system for driving a computer, for example, Windows® etc., as well as a control program according to the present invention. In addition, the memory 206 may temporarily or semi-permanently store the data generated when controlling the controller 201 and the results thereof.

According to the configurations described above, the operations of the auxiliary input devices and the computer will be described again briefly.

An auxiliary input device is a hardware device that recognizes Morse code alphabets. Accordingly, an auxiliary input device configured in an eyeglass type recognizes a wearer's eye blinking as Morse code alphabets. At this time, the eyeglass-type auxiliary input device recognizes and converts blinking of left and right eyes into Morse code alphabets and transmits the Morse code alphabets to the computer. The basic principle of recognizing the eye blinking is that, when infrared rays are irradiated around eyes, the amount of infrared rays reflected when the eyes are closed is different from the amount of infrared rays reflected when the eyes are opened. Alternatively, in a case of an auxiliary input device configured in a switch type, switches are fabricated to recognize Morse code alphabets. Using two switches, a signal for each switch is converted into Morse code alphabets and the Morse code alphabets are transferred to the computer. At this time, the signals input from the two switches are long and short signals, respectively.

Figure 3:
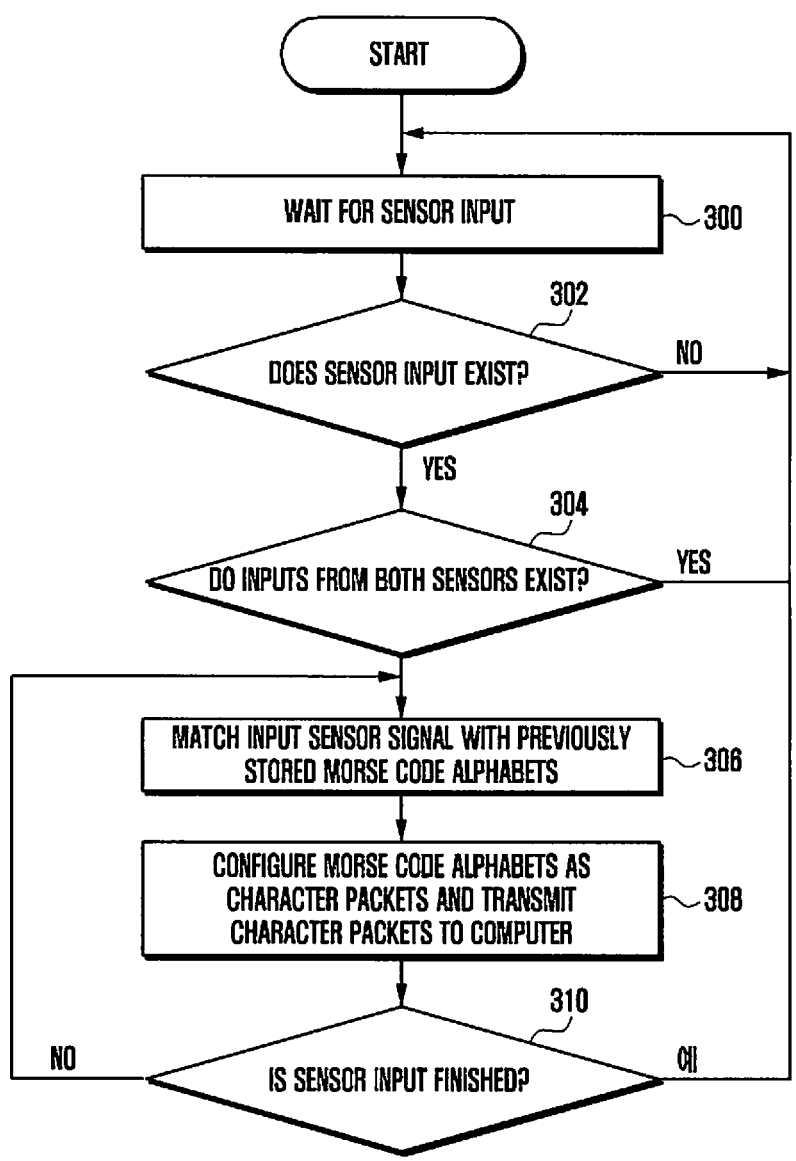
FIG. 3 is a flowchart illustrating a case in which a signal is input and transmitted in an eyeglass-type auxiliary input device, according to an embodiment of the present invention.

FIG. 3 is a flowchart illustrating a process of inputting and transmitting a signal in the eyeglass-type auxiliary input device, according to an embodiment of the present invention.

At step 300, the module controller 115 waits for an input from the sensor 112 or 122. The input from the sensor 112 or 122 means an input corresponding to a movement of an eyelid. That is, when an eyelid moves, the reflected amount of the light transmitted to the corresponding eyeball from the infrared ray transmitters 111 and 121 is changed. Thus, the module controller 115 is in a state where it waits for a signal to be input which is related to a change in the reflected amount of the light.

The module controller 115 proceeds to step 302 to determine whether an input from the sensors 112 and 122 exists. When an input exists from the sensors 112 and 122, the module controller 115 proceeds to step 304, and when an input from the sensors 112 and 122 does not exist, the module controller 115 continuously executes step 300. When an input from the sensors 112 and 122 exists, the module controller 115 determines whether the input is a signal input from both the sensors at step 304. That is, this is the case where only one eye's closing is set as a start signal as described above. Accordingly, step 304 may be regarded as a step of determining whether initiation of a user input is requested. In a case where the initiation of a user input is set by another method, for example, an action of closing an eye for a predetermined length of time, step 304 may be set to another method for detecting the initiation according to the set method.

At step 304, when it is determined that inputs from both the sensors 112 and 122 exist, the module controller 115 proceeds to the waiting state of step 300. That is, it is determined that the user blinked his/her eyes due to fatigue or out of awareness. However, as a result of the determination of step 304, when an input from only one of the sensors 112 and 122 exists, the module controller 115 proceeds to step 306.

When the module controller 115 proceeds to step 306, the module controller 115 matches the signals input from the sensors 112 and 122 with previously stored Morse code alphabets. In some cases, step 306 may not be conducted by the auxiliary input device. However, in the embodiments of the present invention, descriptions will be made on a case where step 306 is conducted by the auxiliary input device. If step 306 is not conducted in the auxiliary input device, step 306 may be conducted by the computer 200.

After matching the signals input from the sensors 112, 122 with the previously stored Morse code alphabets at step 306, the module controller 115 proceeds to step 308. The module controller 115 performs a control such that matched Morse code alphabets are configured into packets according to a method for communicating with the computer 200 and the packets are transmitted to the computer. That is, the module controller 115 controls the computer communication unit 113 to transmit the generated packets to the computer 200.

Subsequently, the module controller 115 proceeds to step 310 and determines whether sensor input termination is requested. When the sensor input termination is requested, the module controller 115 proceeds to step 300. However, when the sensor input termination is not requested, the module controller 115 proceeds to step 306 and continuously detects a signal which the user wishes to input through the detection of the movement of the eyelids.

In addition, in the present invention, because both eyes are used, the movement of one eyelid may be made to correspond to a long signal of the Morse code alphabets and the movement of the other eyelid may be made to correspond to a short signal.

In addition, when Bluetooth communication is used, a protocol transmitted when data is transmitted as a packet-type character string from the auxiliary input device makes the computer receive the character string except for an incorrect packet by adding "A" at the front of the character string and "X" at the end of the character string. In addition, the character string between "A" and "X" may be classified by long and short signals, i.e. dashes ("-") and dots (".") corresponding to the movements of the eyelids to configure one packet frame and the packet frame may be transmitted. A frame configured in this manner may take a form of "A---.---..X", for example.

Figure 4:
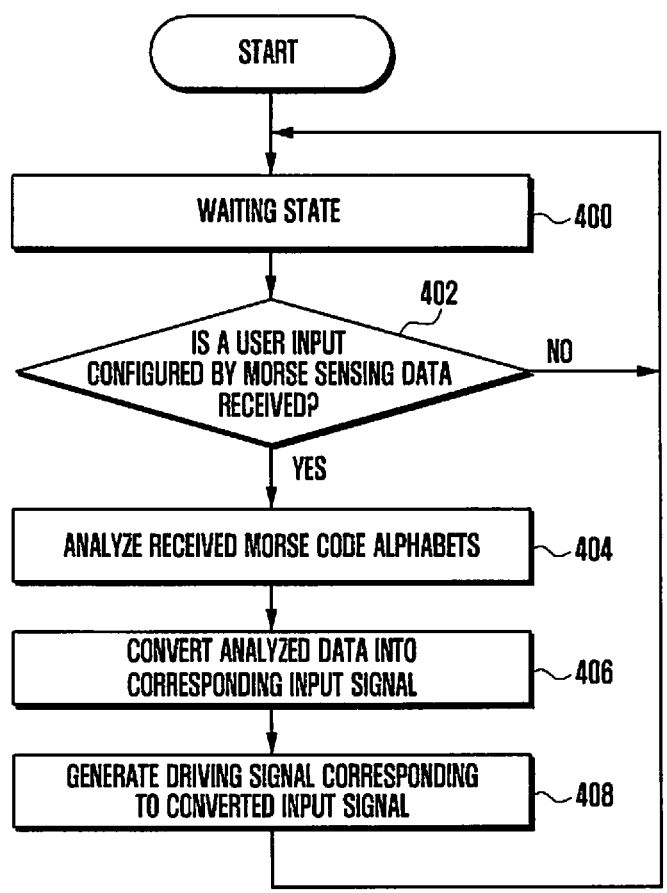
FIG. 4 is a flowchart illustrating a case in which a computer receives data from the auxiliary input device, according to an embodiment of the present invention.

FIG. 4 is a flowchart illustrating a computer receiving an input from the auxiliary input device, according to an embodiment of the present invention.

At step 400, the controller 201 maintains the waiting state. Here, the waiting state means a state of waiting for an input of a specific command from the user after power is supplied to the computer 200 and an operation system to be used is driven. That is, in an ordinary case, because the user inputs a command through a keyboard and/or a mouse, the waiting state means a state of waiting for this command and at the same time, includes a state of waiting for a user input to be received from the wireless communication unit 202 according to the present invention. In the following description, only the state of waiting for the user input to be received from the wireless communication unit 202 will be described.

At step 402, the controller 201 determines whether a user input configured by Morse sensing data is received through the wireless communication unit 202. As a result of the determination of step 402, when the user input configured by Morse sensing data is not received, the controller 201 proceeds to step 400, and when the user input configured by Morse sensing data is received, the controller proceeds to step 404.

Upon proceeding to step 404, the controller 201 analyzes the received Morse code alphabets. The analysis of the Morse code alphabets may result in different information according to the currently used mode. For example, when it is desired to input a key value through a keyboard, the same Morse code alphabets may be mapped to different key values. This will be described in more detail with reference to drawings to be described later.

Then, the controller 201 converts the Morse code alphabets analyzed at step 406 into a corresponding user input signal, and controls the screen processing unit 204 to display the user input signal through a display device such as a monitor. In addition, the input value may not be a simple character input or key value. In such a case, the controller 201 generates a driving signal corresponding to the converted input signal at step 408, and controls the operation according to the driving signal. When displaying such a processing to the user, the controller 201 controls the screen processing unit 204 to display the processing through a display device such as a monitor.

Now, descriptions will be made on operations which is capable of being processed by the controller 201 according to Morse code alphabets will be described.

The controller 201 performs a control for supporting an operation of a virtual mouse. The virtual mouse is configured to support an operation which is the same as or similar to an operation of a mouse which is one of computer input devices used by a general user. That is, the virtual mouse according to the present invention provides almost all the functions of an ordinary mouse. Unlike the auxiliary input devices for disabled people which have been presented up to now, the present invention provides an auxiliary input device that executes a control through eye blinking. Thus, in order to minimize fatigue from performing the control, the present invention additionally provides a split movement key configured to be capable of splitting the entire screen to perform a jump, in addition to the basic 8-directional movement for a movement method of a mouse pointer, a repeat key configured to be capable of performing a previous movement or behavior again, etc. In addition, the auxiliary input device of the present invention performs functions specialized to a web browser such as Internet Explorer®, for example, a control for opening or closing a webpage, moving to a previous webpage, or providing a next webpage, etc.

In addition, the controller 201 performs a control for providing a virtual keyboard. The virtual keyboard may provide almost all the functions of a conventional keyboard. The auxiliary input devices for disabled people, which have been presented up to now, provide only a virtual mouse and provide a typing function by moving a mouse pointer to a keyboard symbol of a tablet input device and left-clicking the mouse. In such a case, a large number of movements of eyes are needed in order to complete a word and a sentence. In order to solve this problem, an auxiliary input device according to an embodiment of the present invention is provided with its own virtual keyboard which enables a key input by a single input. An object to be typed may be selected and typed through eye blinking suitable for the object, and, for the user's convenience, a macro function for inputting a previously prepared sentence and a repeat key which is the same as a mouse are provided.

The controller 201 provides an input using eye blinking and Morse code alphabets according to an embodiment of the present invention. The eye blinking is matched with the Morse code alphabets to be used as a control signal of the keyboard and the mouse. For example, the blinking of the left eye is defined as a short signal (i.e., dot (".")) and the blinking of the right eye is defined as a long signal (i.e., dash ("-")). By controlling the computer through eye blinking, it is possible to reduce eye fatigue as compared with the existing control methods based on pupil-tracking and may control a fine movement when using a mouse.

In addition, the controller 201 re-defines Morse code alphabets according to use frequency. By re-defining the generally used Morse code alphabets, convenience may be maximized. In fact, Morse code alphabets corresponding to the inputs frequently used when using the keyboard and the mouse are defined in such a manner that Morse code alphabets corresponding to a relatively more frequently used input are relatively short in length and Morse code alphabets corresponding to a relatively less frequently used input is relatively long in length. For example, the Morse code alphabets corresponding to the "Enter" input of the keyboard and the "Left Click" input of the mouse may be defined to be short in length.

In addition, an embodiment of the present invention provides controllers of which the use range is broad. The existing auxiliary input devices for disabled people provide a solution only for one disability. However, the auxiliary input device according to an embodiment of the present invention enables use of the "mouse" or the "keyboard" through any body part as long as the body part can express two signals so that any disabled person may easily select and use a controller according to a disability or preference, if possible. In addition, since Bluetooth is used in communication between a controller and the computer, an inconvenience caused by wires may be removed.

In addition, input signals are re-defined according to the user's preference. A customizing function that may re-define and use the existing input signals according to the user's preference may be supported. Through the customizing function, the user may change the previously designated input signals of the keyboard and the mouse according to the user's preference and use the changed input signals.

Further, in accordance with an embodiment of the present invention, an auto-complete input function may be supported. Unlike the existing auxiliary input devices, an auxiliary input device according to an embodiment of the present invention may minimize eye fatigue which may be caused from keyboard-inputting by supporting its own "keyboard" and provides the auto-complete input function for the user's convenience and typing speed. When the user inputs a text, an initial consonant search or a keyword search may be performed using a dictionary DataBase (DB).

In addition, in accordance with an embodiment of the present invention, a user interface (UI), a special key and a macro key may be provided. In order to minimize the screen of the virtual keyboard, infrequently used keys are bound together as toggle type keys so that the infrequently used keys are not displayed on the screen normally and displayed when a specific key is input to enable a use thereof. Function keys cause an F1 key to an F12 key to be displayed on the screen so as to input the keys or hide the keys from the screen. The macro key combines keys desired by the user so that a key combination may be used as one key input. In addition, when a sentence frequently used by the user is registered through the macro key, one sentence may be input by one input signal and when a specific process is registered, a program may be executed by one input signal. In addition, a special input key that enables inputting of a special character and as hide key that causes a keyboard screen or a mouse screen to be hidden or shown according to the user's preference may be provided.

In order to make Morse code alphabets suitable for the user's convenience, the Morse code alphabets should be re-defined as described above. In order to use the operations of the keyboard and the mouse using Morse code alphabets through the auxiliary input device, re-definition should be made to be suitable for this purpose. As described above, in general, there are special keys that are frequently used when using a computer besides ordinary keyboard keys. Accordingly, with reference to the paper entitled "Method of Improving Hangeul Morse Code Alphabets", Morse code alphabets are re-defined as in the following Table 1.

TABLE 1

| | | | Keyboard | | | |
|---|---|---|---|---|---|---|
| + | Context | • — — • | ㅂ | • — • — — | Korean/English | |
| • | Enter | • — — — | ㅕ | • — — • • | Chinese Character | |
| — | Refresh | — • • • | ㅐ | • — — • — | Number/English | |
| • • | Space | — • • — | ㅔ | • — — — • | Comma | |
| • — | Back Space | — • — • | ㅊ | • — — — — | Dot | |
| — • | ㅇ | — • — • | ㅍ | — • • • • | Insert | |
| — — | ESC | — — • • | ㅌ | — • • • — | Delete | |
| • • • | ㅏ | — — • — | ㅛ | — • • — • | Home | |
| • • — | ㄴ | — — — • | ㅑ | — • • — — | End | |
| • — • | ㅣ | — — — — | ㅠ | — • — • • | Pageup | |
| • — — | ㅓ | • • • • • | Down | — • — • — | Pagedown | |
| — • • | ㄹ | • • • • — | Up | — • — — • | Function | |
| — • — | — | • • • — • | ㅕ | — • — — — | Macro | |
| — — • | ㅅ | • • • — — | Left | — — • • • | Atocomplete | |
| — — — | ㅗ | • • — • • | Right | — — • • — | Main | |
| • • • • | ㅐ | • • — • — | Ctrl | — — • — • | Size | |
| • • • — | ㅡ | • • — — • | Alt | — — • — — | Option | |
| • • — • | ㅈ | • • — — — | Shift | — — — • • | No define | |
| • • — — | ㅎ | • — • • • | Win | — — — • — | No define | |
| • — • • | ㅁ | • — • • — | Caps | — — — — • | No Define | |
| • — • — | ㅜ | • — • — • | Tab | — — — — — | Hide/Show | |

| | | | Mouse | | | |
|---|---|---|---|---|---|---|
| + | Context | • • • | Top Left | — — — — | Bottom Right | |
| • | Left Click | • • — | Top | • • • • | Double Right Click | |
| — | Middle | • — • | Left | • • • — | Option | |
| • • | Double Left Click | • — — | Top Right | — — • • | Left Right Click | |
| • — | Wheel Down | — • • | Right | — — — • | Split Move | |
| — • | Wheel Up | — • — | Bottom Left | — — — — | Drag | |
| — — | Right Click | — — • | Bottom | — — — — — | Hide/Show | |

Meanwhile, there are problems to be basically solved in order to generate a virtual keyboard. An auxiliary input device transfers a signal, which is input not by using a physical keyboard but through the user's eye blinking, to the virtual keyboard. A common keyboard is designed based on English characters. However, Korean (Hangeul) characters are characterized in that each character is composed of an initial consonant, a medial, and a final consonant. These are not provided on any component of practical programming. The commonly discussed issue of a Hangeul typing system is a will-o'-the-wisp phenomenon. According to the will-o'-the-wisp phenomenon, because it is not exactly known whether a consonant is an initial consonant or a final consonant, the consonant is firstly deemed as a final consonant and thus firstly attached to the position of the final consonant of a character. Then, when the next input is the medial, the consonant is moved and attached to the position of the initial consonant of the next character. A perceived object and a really displayed object may not coincide with each other. A process of inputting is Hangeul word, for example, 가을, is displayed as represented in Table 2.

TABLE 2

| Input Sequence | Display |
|---|---|
| ㄱ | ㄱ |
| ㄱ ㅏ | 가 |
| ㄱ ㅏ ㅇ | 강 |
| ㄱ ㅏ ㅇ ㅡ | 가으 |
| ㄱ ㅏ ㅇ ㅡ ㄹ | 가을 |

In order to solve the problem as in Table 2, an automata state diagram is used.

Figure 5:
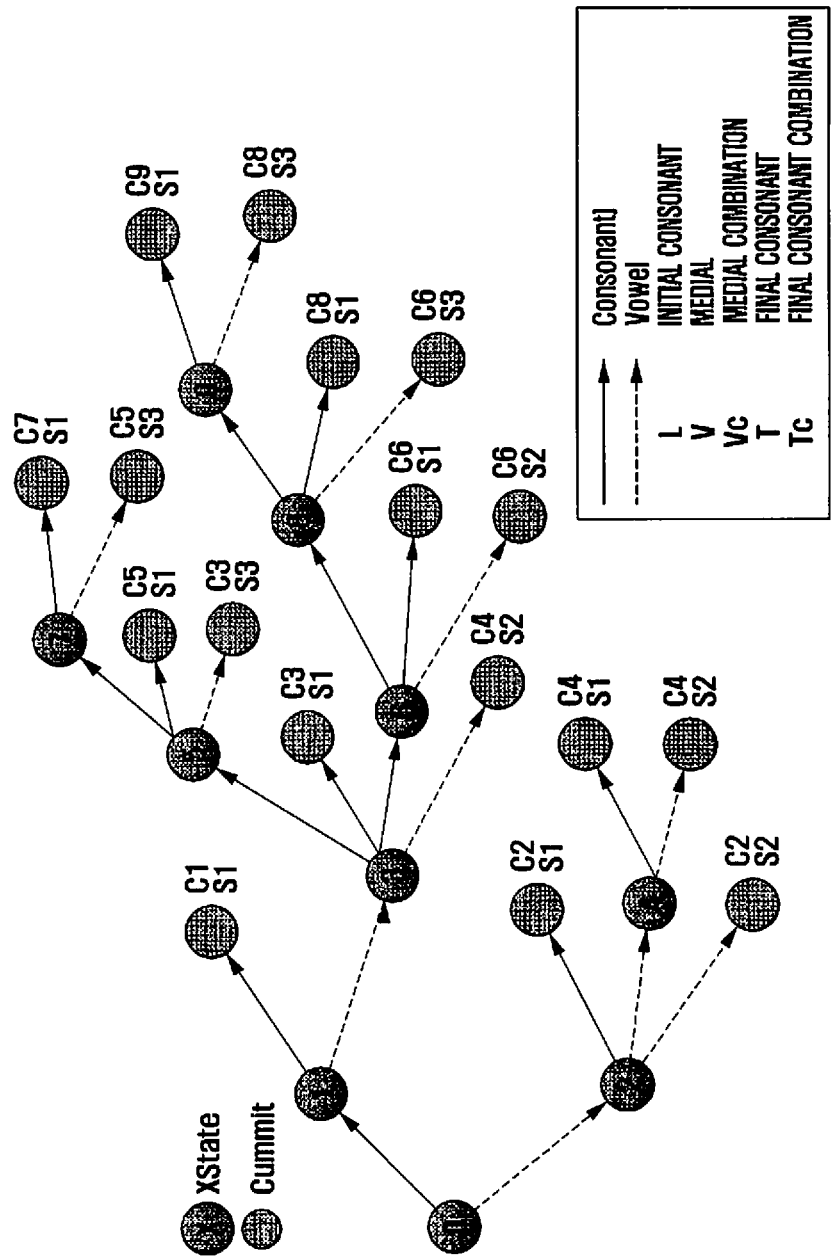
FIG. 5 is an automata state diagram for detecting a Hangeul (Korean alphabet) input.

FIG. 5 illustrates an automata state diagram for detecting a Hangeul input.

A Hangeul automata is a method of implementing one character by inputting an initial consonant, a medial and a final consonant in which a consonant/vowel of a character subsequently input at a standby state via an initial consonant standby state, a medial standby state and finally a final consonant standby state is determined to express one completed character. For example, when one consonant and one vowel are input in this order and then a consonant is input, the finally input consonant is classified as a final consonant. Then, when a vowel is input again, a new character is combined.

In general, an operating system such as Windows®-based user interface is generally configured such that input may be performed on Windows® with a focus. Accordingly, in order to use the auto-complete text (AutoComplete Text) function provided by the auxiliary input device, the focus should be brought to the auxiliary input device. Although the auxiliary input device is a special keyboard, a proper input is allowed only when an ordinary virtual keyboard always maintains the focus on a target process.

In addition, if key codes are long when calling keys plural times as in a case of moving a mouse curser, a considerable inconvenience is caused in overlapping use. Thus, a repeat key configured to store and reuse the key information lastly input by the user is provided. When the repeat key is used, a lastly input event may be re-executed identically and the information is maintained until another key is input.

Meanwhile, in general, a keyboard and a mouse are used to control a computer. A system implemented in the auxiliary input device also provides a keyboard and a mouse. However, because the auxiliary input device uses Morse code alphabets, it is not easy to control the keyboard and the mouse simultaneously. Accordingly, rapid conversion of the virtual mouse and the virtual keyboard is a very important factor. Besides dot (.) and dash (-) are used in the existing Morse code alphabets, a new symbol, "+", may be defined when an eye is closed for a length of time equal to or longer than an average time. Accordingly, this signal may be used as a signal for converting the virtual keyboard and the virtual mouse.

In addition, the auxiliary input device may provide generally three macro functions. First is a function of combining and calling up to four keys such as control keys (e.g., Ctrl, Alt, and Shift keys), etc., and second is a function of executing a designated process instantly. Finally, a text macro function of outputting a previously input sentence is provided. The user may designate a macro at a position of a previously designated key angle on a macro setting screen.

Figure 6A:
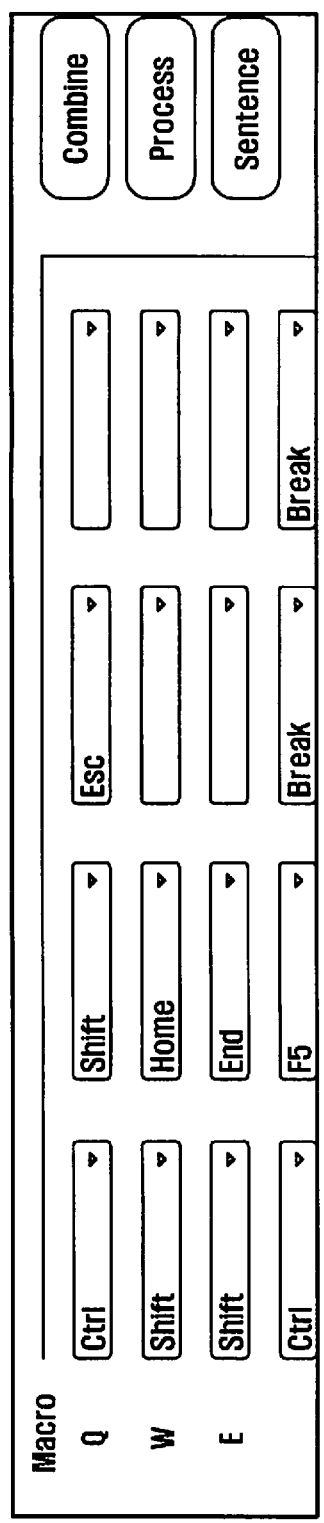
FIGS. 6A-6C are diagrams describing methods of defining a macro, according to an embodiment of the present invention.
Figure 6B:
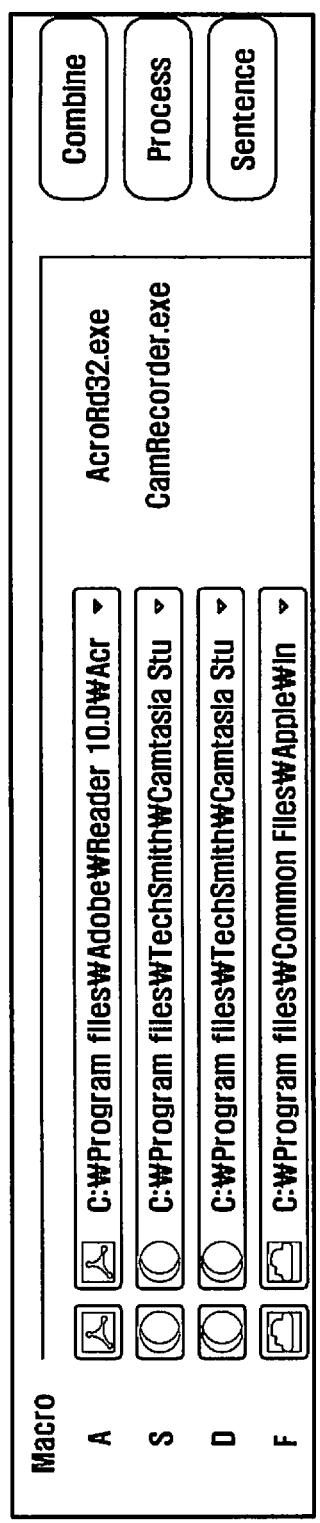
Figure 6C:
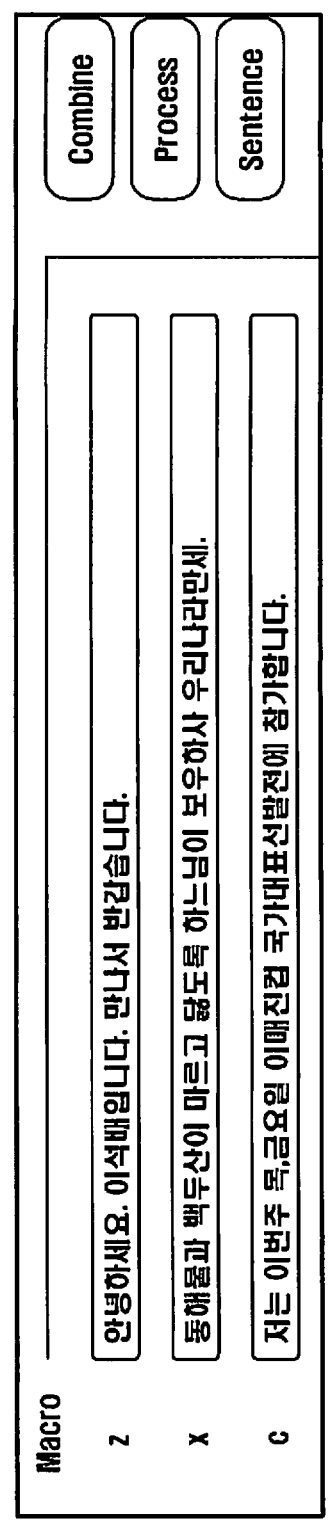

FIGS. 6A-6C illustrate diagrams for describing methods of defining a macro, according to an embodiment of the present invention.

As illustrated in FIG. 6A, a combination of a plurality control keys may be defined as a macro using keys, as illustrated in FIG. 6B, a specific program may be defined as a macro, and as illustrated in FIG. 6C, a macro may be defined in a form which may transmit a text previously set by the user.

FIGS. 7A to 7E are diagrams illustrating user interfaces of virtual keyboards, according to an embodiment of the present invention.

Figure 7A:
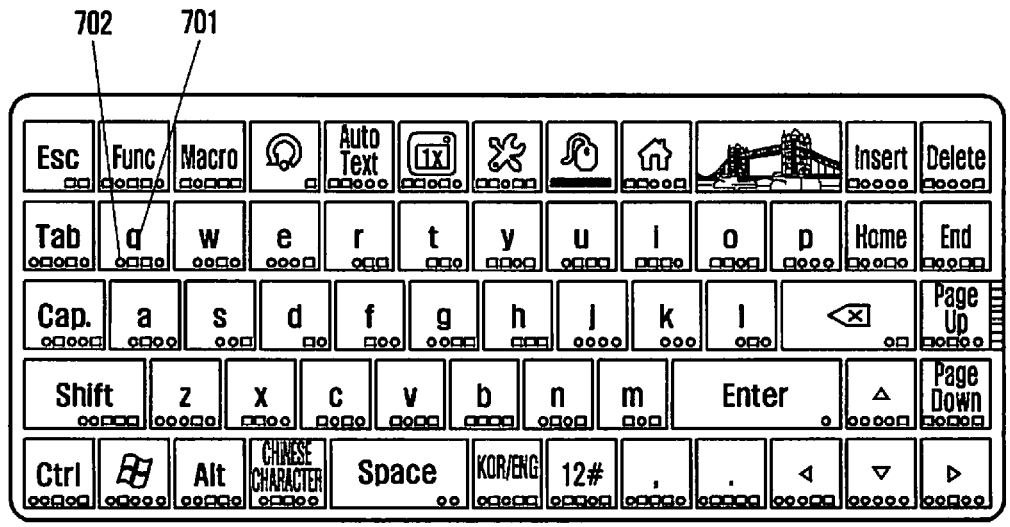
FIGS. 7A-7E are diagrams illustrating user interfaces of a virtual keyboard, according to an embodiment of the present invention.

FIG. 7A illustrates a QWERTY keyboard form. When a virtual keyboard is executed, a basically set screen is displayed based on a QWERTY keyboard. Referring to main keys of the QWERTY keyboard, the "Func" key at the first row is configured to call F1 to F12 keys. The "Macro" key is configured to call a combination key, a process execution function, and a sentence macro function. The "AutoText" key is configured to turn On/Off the AutoComplete Text function. In addition, the "1×" key is configured to allow the size of the keyboard to be changed to a multiple of 0.8×, 1×, or 1.5×. In addition, a setting key allows the user to customize Morse code alphabets and to perform macro setting.

Figure 7B:
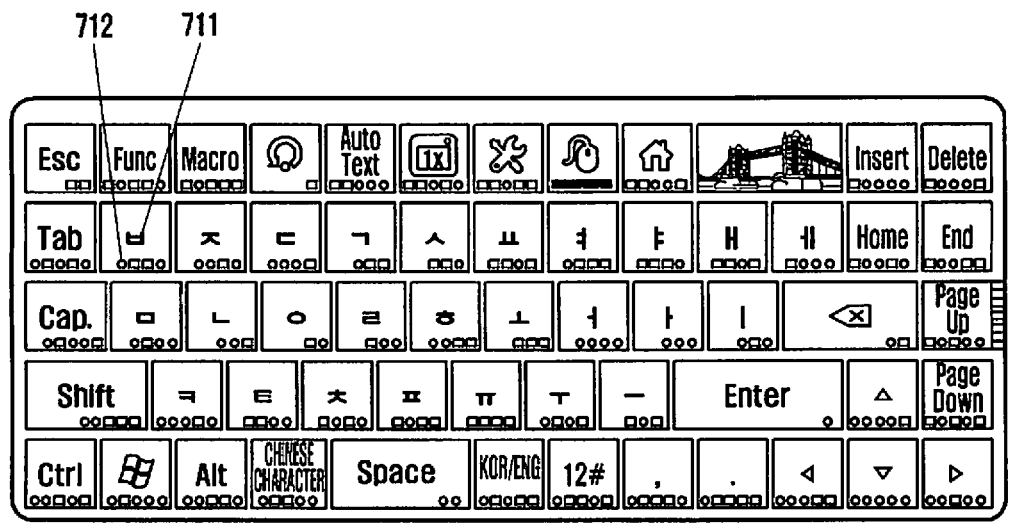
Figure 7C:
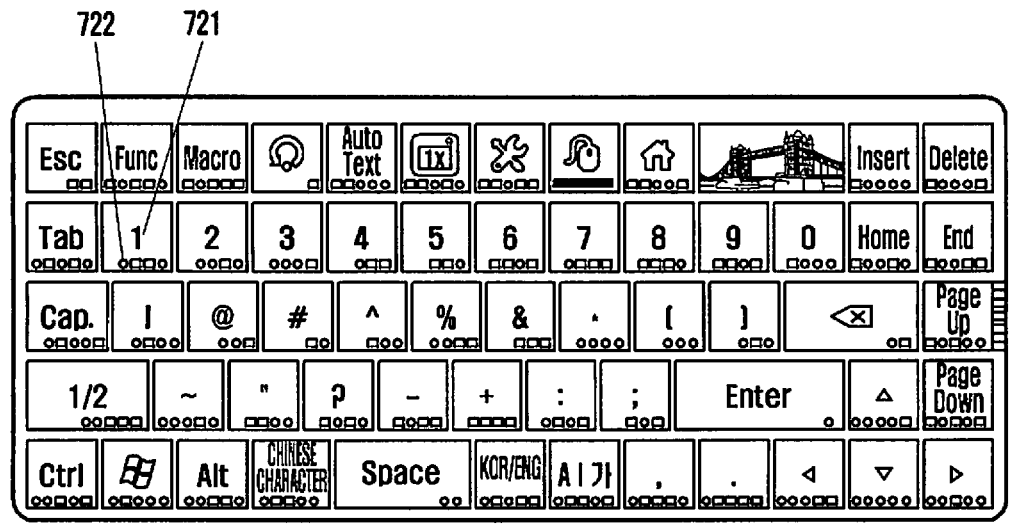
Figure 7D:
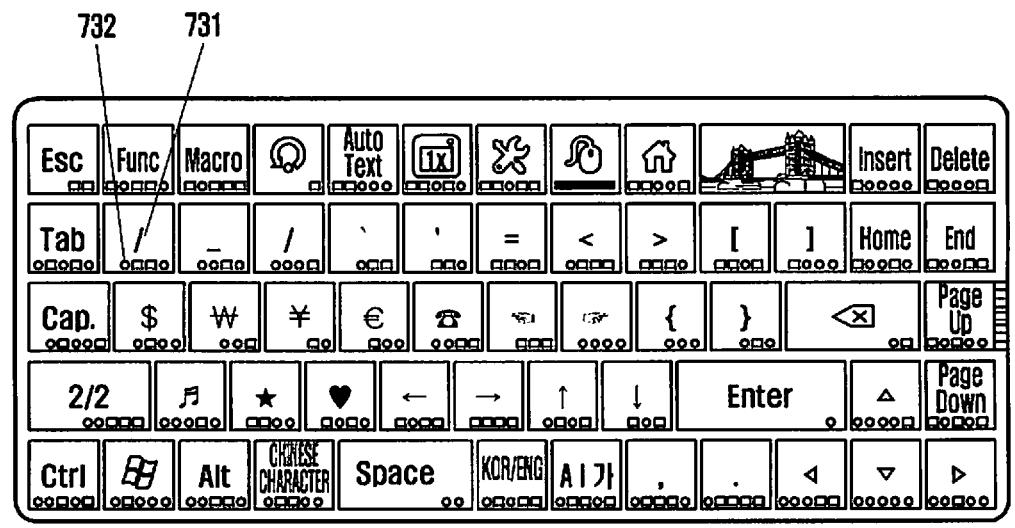
Figure 7E:
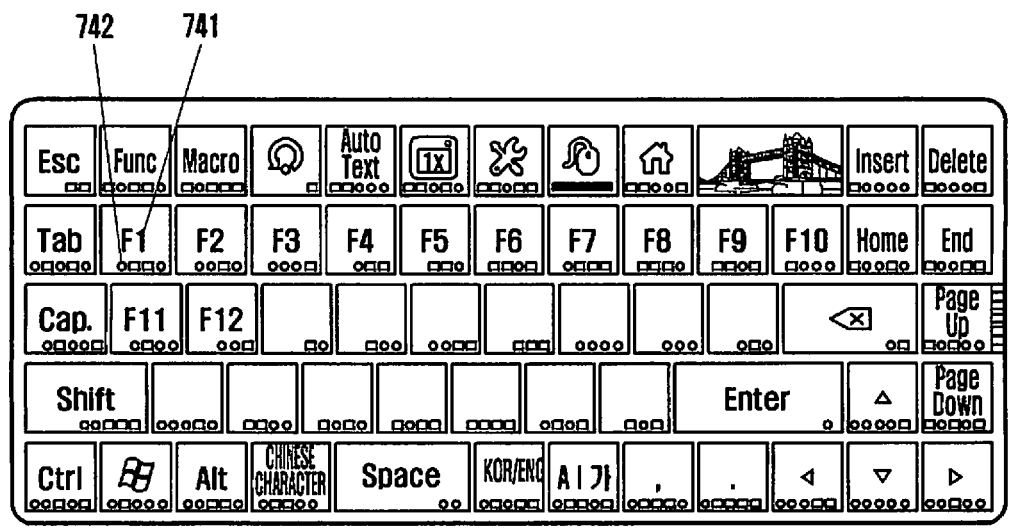

FIG. 7B illustrates a Hangeul keyboard form, FIG. 7C illustrates a numeric keyboard form, FIG. 7D illustrates a special character keyboard form, and FIG. 7E illustrates a function key keyboard form.

FIG. 7B illustrates a Hangeul (Korean alphabet) keyboard changed from a basic QWERTY keyboard so that Hangeul (Korean alphabet) may be input, and FIG. 7C illustrates a numeric keyboard where numbers from 0 to 9 and various figures may be input. FIG. 7D illustrates a keyboard form for inputting special characters where additional special characters may be input and FIG. 7E illustrates a keypad which allows the user to input the keys from the key F1 to the key F12.

In FIGS. 7A-7E, reference numerals 701, 711, 721, 731, and 741 indicate Morse code alphabets input by the user and it may be appreciated that all the Morse code alphabets are equal to each other. However, when the displayed keyboards are different from each other, the same input value may be matched to different values.

Meanwhile, the keyboards may be removed from a Windows® background of the computer 200. That is, a function of hiding an unused keyboard may be provided.

Figure 8:
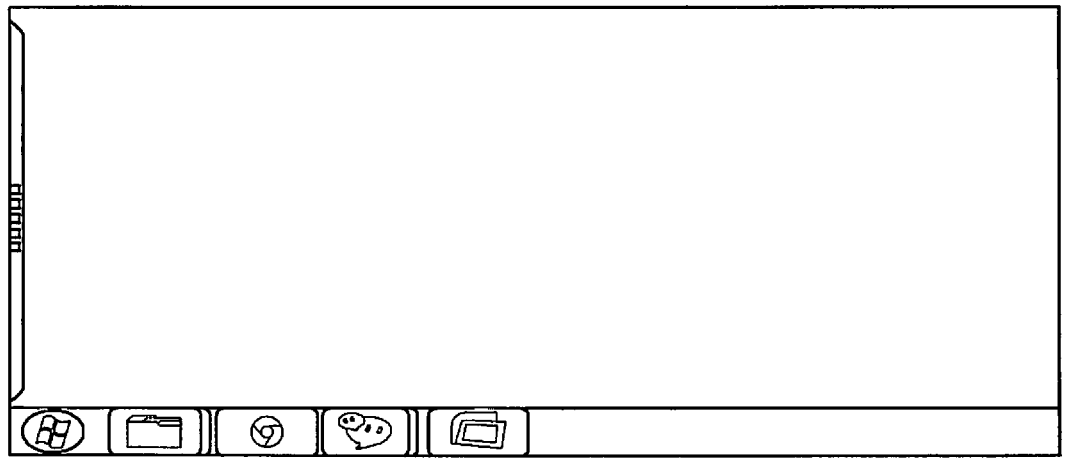
FIG. 8 is a diagram illustrating a state where the virtual keyboard is hidden from the screen in the computer, according to an embodiment of the present invention.

FIG. 8 is a diagram illustrating a state where the virtual keyboard is hidden from the screen in the computer, according to an embodiment of the present invention. When the virtual keyboard is hidden from the entire screen as illustrated in FIG. 8, disturbance of other operations may be minimized.

The virtual mouse may also be implemented in the same manner as the virtual keyboard and Morse code alphabets may be used after being re-defined to be different from the keyboard. Since there is a relatively large signal margin as compared with the keyboard, individual key signals may be defined sequentially from the shortest signal. As supported functions, eight directional movements of, for example, up, down, left, right, etc. may be provided and left/right click, left/right double click, left/right simultaneous click, wheel-up, wheel-down, drag, etc. are provided. As a function according to the present invention, a screen splitting movement is possible. Since the virtual mouse is moved through Morse code alphabets, a problem of slow moving speed which serves as a limiting factor may be solved.

In addition, in order to maximize the user's Internet use ability, the virtual mouse allows the user to use functions such as execution of a browser (such as Internet Explorer®), browser closing, screen magnification, screen reduction, and favorites.

Figure 9A:
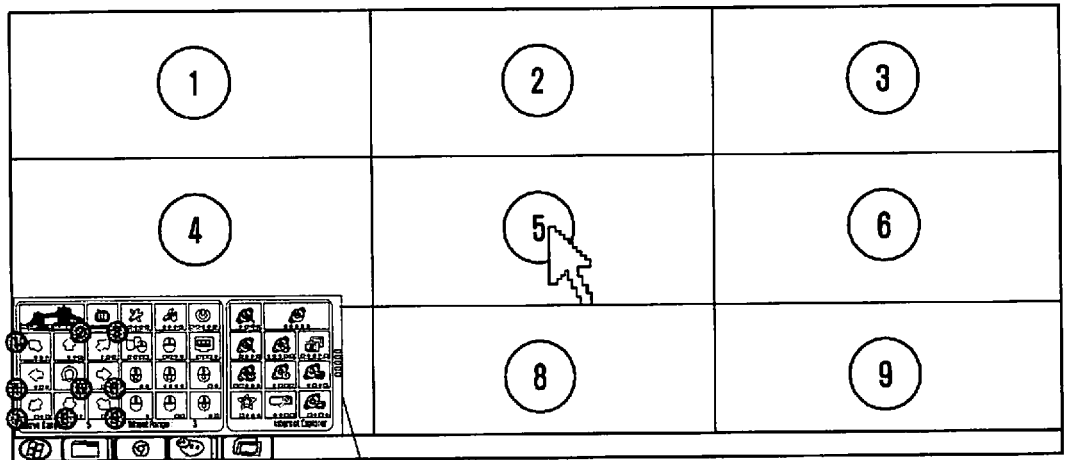
FIG. 9A is a diagram illustrating a split screen and a control board configured to control a virtual mouse when the virtual mouse is used, according to an embodiment of the present invention.
Figure 9B:
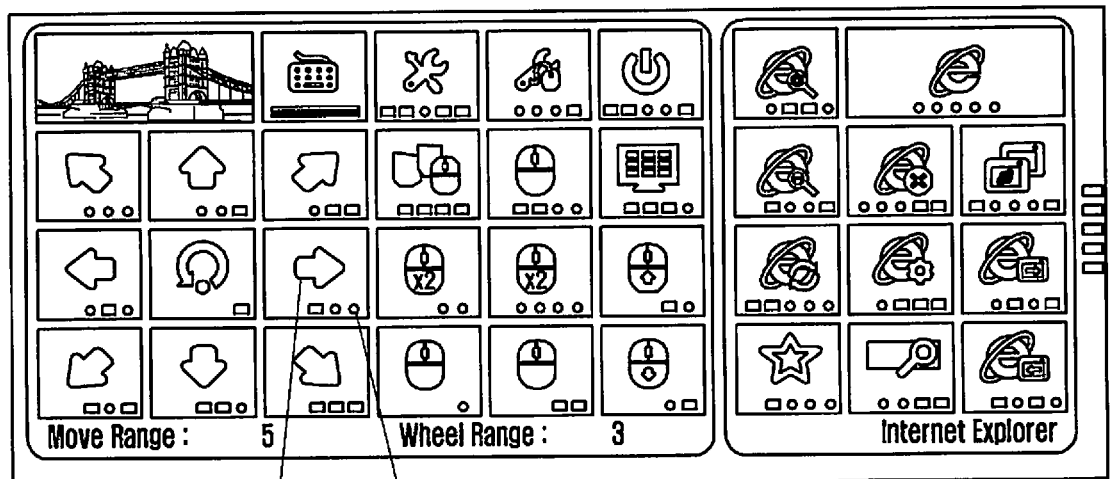
FIG. 9B is a diagram illustrating only the control board configured to control the virtual mouse, according to an embodiment of the present invention.

FIG. 9A is a diagram illustrating a split screen and a control board configured to control a virtual mouse when the virtual mouse is used, according to the present invention, and FIG. 9B is a diagram illustrating only the control board configured to control the virtual mouse, according to the present invention.

The screen is split into nine equal portions as illustrated in FIG. 9A so as to move a mouse pointer. This method allows the mouse pointer to be moved to a desired point among the coordinates of Nos. 1 to 9 by two operations through a specific signal. When the screen splitting function is initially executed, the screen is split into nine equal portions and a grid is drawn as illustrated in FIG. 9A. At this time, when a signal of a desired point is input, the mouse pointer is instantly moved to the corresponding coordinate. Through this function, the movement of the mouse may be easily performed.

In addition, in order to make a mouse pointer move smoothly, the moving radius of the mouse pointer and the moving radius of the wheel may be adjusted. This is displayed at a left bottom end of a mouse control board. The mouse control board may be configured such that the moving radius of the mouse may be adjusted by five pixels (px) and the moving radius of the wheel may be increased or decreased by one scroll. The amount of the moving radius of the mouse may be confirmed at a lower end of the screen. That is, when the mouse control board illustrated in FIGS. 9A and 9B is provided, various functions of the virtual mouse such as moving, click, wheel, drag, screen splitting moving, Internet function, and setting of the moving radius may be performed.

In FIG. 9B, reference numeral 912 represents Morse code alphabets and reference numeral 911 represents a movement corresponding thereto.

In addition, in order to allow the user to input a text more smoothly, the auxiliary input device provides an auto-complete text (AutoComplete Text) function. When the user inputs characters, the function performs a search in a dictionary DB through an initial consonant or a keyword and automatically completes the words selected by the user. When calling automatically completed words, the words are output according a frequently used order, and whenever a word is automatically completed, the count thereof is increased so as to enhance the order of priority.

Basically, when a word is automatically completed using the virtual keyboard, the count in the data base is updated. In addition, learning of words is supported. In the available range, txt, xsl, ppt, and doc files may be included. The learning method is as follows. A file of a corresponding extension is opened and all the sentences are converted into a text form, and then a list of substantives is extracted from a long sentence using a morphological analyzer. Then, the number of repetitions is checked for the substantives and the database is made to learn the words which are repeated two times or more.

Since it is not easy to make words using Morse code alphabets, it is necessary to allow related words to be searched for only using initial consonants. Basically, Hangeul consists of 19 initial consonants, 21 medials, and 27 final consonants. In addition, there is a rule in which, when a medial is changed, the difference in code value is 28, when an initial consonant is changed, the difference in code value is 588 (21×28), and the first code value for Hangeul (the code value of "가") is 44032. Here, a code may be a Unicode. A method of calculating a consonant, a medial, and a final consonant using the rule is as follows:

Initial consonant: A quotient which is obtained by subtracting 44032 from a code of a character and then dividing the quotient obtained by the subtraction by 21×28: 0~18;

Medial: A quotient which is obtained by subtracting 44032 from a code of a character, dividing the quotient obtained by the subtraction by 21×28, and then dividing again the remainder obtained by the division by 28: 0~20; and Final consonant: A remainder which is obtained by subtracting 44032 from a code of a character, dividing the quotient obtained by the subtraction by 21×28, and then dividing again the remainder obtained by the division by 28: 0~27.

Based on the rule described above, an SQL (Structured Query Language) is prepared and a search is performed. When only initial consonants are included in a Hangeul combination, an initial consonant search is used. However, when one character is completed, a search using a keyword is required. In addition, it is determined whether a character is completed through a separation of an initial consonant, a medial and a final consonant so as to perform a search using Like of SQL. In addition, when separating the initial consonant, the medial and the final consonant, the formula as described above is used.

In addition, the signal customizing function may control the auxiliary input device by re-defining the pre-defined Morse code alphabets at the user's convenience rather than controlling the auxiliary input device using the pre-defined Morse code alphabets.

Figure 10A:
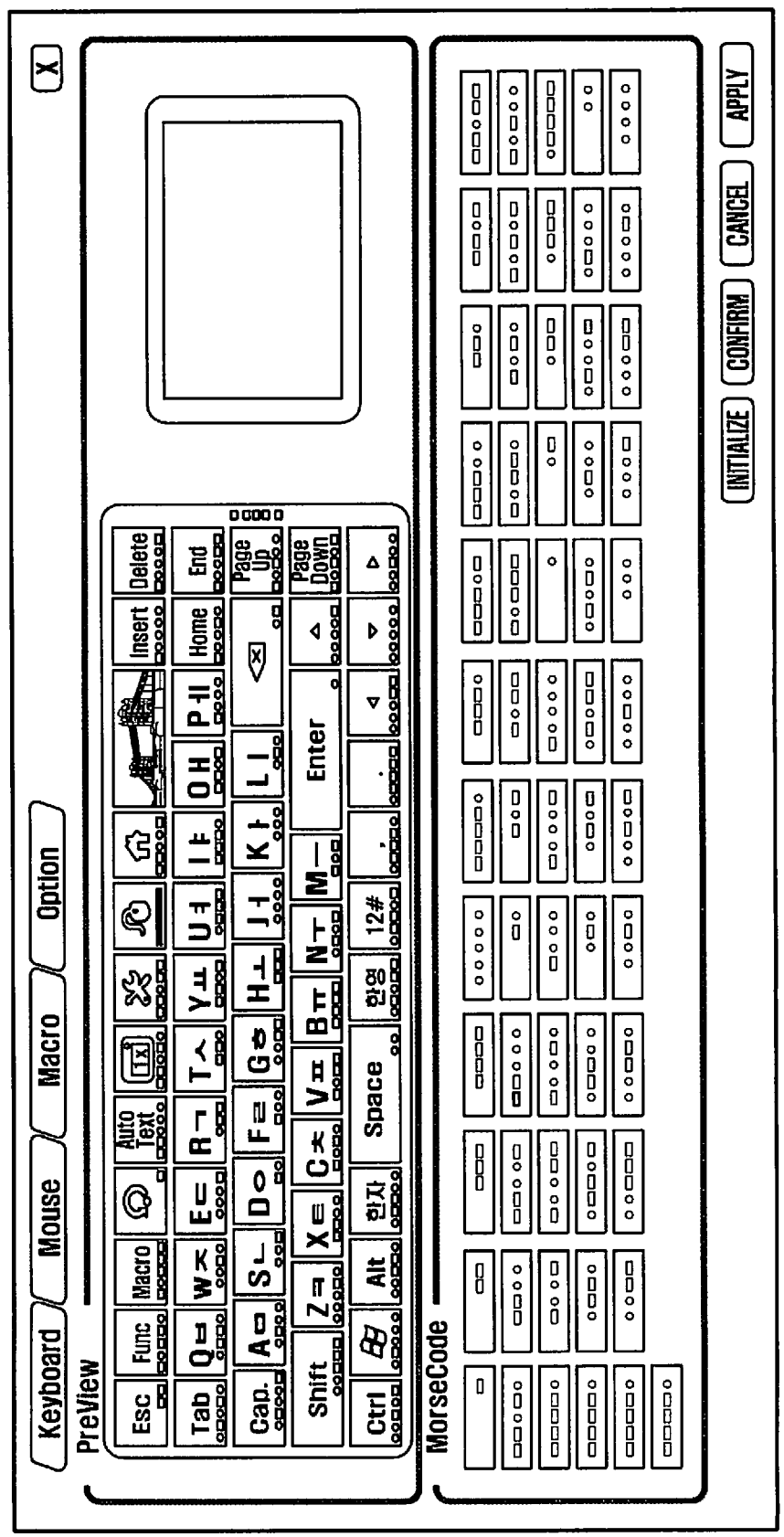
FIGS. 10A and 10B are diagrams illustrating a case where Morse code alphabets are customized to be used, according to an embodiment of the present invention.
Figure 10B:
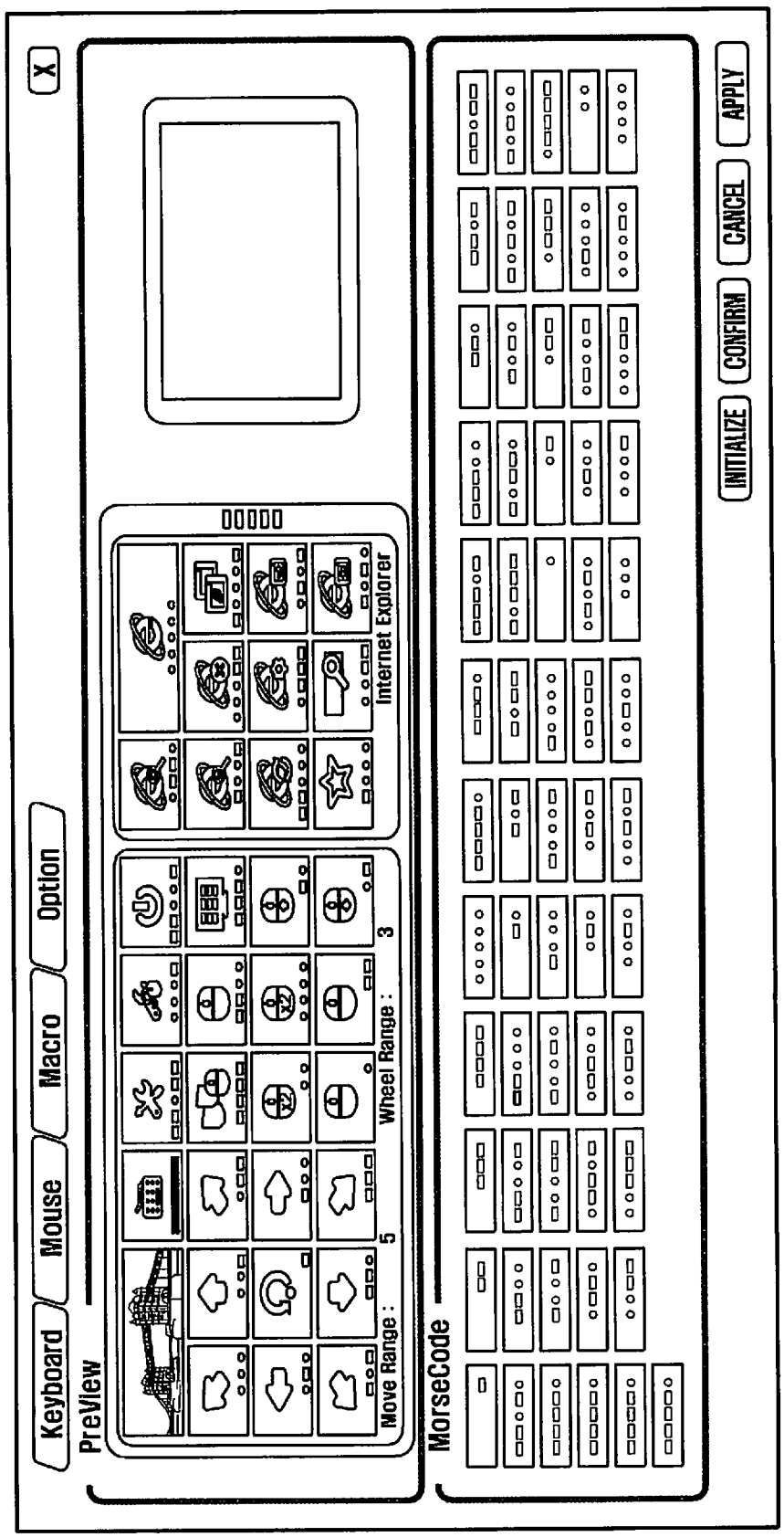

FIGS. 10A and 10B are diagrams illustrating a case where Morse code alphabets are customized to be used, according to the present invention.

As illustrated in FIGS. 10A and 10B, a screen for improving a convenience of re-defining signals may be provided. At an upper portion of each figure, a keyboard screen having already defined signals is disposed, and at a lower portion, all Morse code alphabets are arranged. In addition, at a right top end, a currently selected key angle is displayed in an enlarged scale. Once a key, of which the signal is desired to be changed, is selected, borders are drawn around signals which have not yet been defined, respectively, as indicated at the lower portions of the figures. In addition, on the keyboard screens at the upper portions of the figures, borders are respectively drawn around the key angles which are currently problematic because signals overlap each other. Through this, the user may grasp currently remaining signals more easily and perform customizing while confirming overlapping signals.

Figure 11:
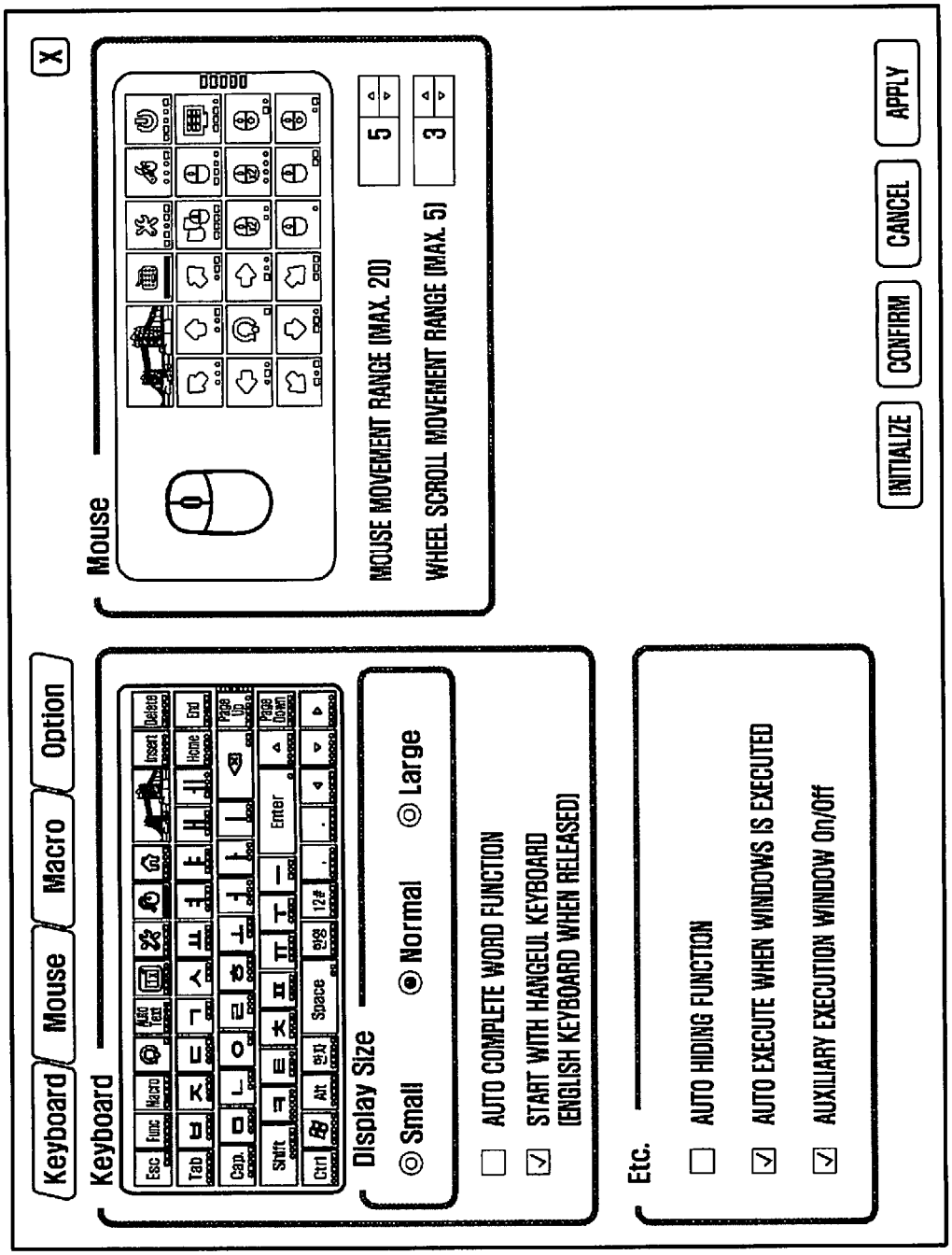
FIG. 11 is a diagram illustrating a screen for setting functions of options such as a size of an initial program starting screen on a computer, according to an embodiment of the present invention.

FIG. 11 is a diagram illustrating a screen for setting functions of options such as a size of an initial program starting screen on a computer, according to the present invention.

As illustrated in FIG. 11, the user may set a size of an initial program starting screen, ON/OFF states of automatic execution, automatic hiding and automatic completion functions, and a moving range of a mouse mode in a desired form on the computer through an option window where the listed items may be designated.

While the present invention has been particularly shown and described with reference to certain embodiments thereof, it will be understood by those of ordinary skill in the art that various changes in form and details may be made therein without departing from the spirit and scope of the present invention as defined by the following claims and their equivalents.

What is claimed is:

1. An auxiliary input device for use in inputting a user signal to a computer, the auxiliary input device comprising:
   a first infrared ray transmitter;
   a first reflected light sensor;
   a second infrared ray transmitter;
   a second reflected light sensor; and
   a controller,
   wherein the first infrared ray transmitter transmits infrared rays towards one eyeball of a user and the first reflected light sensor senses the infrared rays reflected from the one eyeball and generates a first input;
   wherein the second infrared ray transmitter transmits infrared rays towards the other eyeball of the user and the second reflected light sensor senses the infrared rays reflected from the other eyeball and generates a second input;
   wherein the controller receives the first input and the second input, detects a change in the amount of light reflected from each of the eyeballs based on the first and second inputs, generates Morse code based on the detected change, and converts the Morse code into a character string; and
   wherein each of the first and second reflected light sensors initially set a reference value by obtaining a maximum average value and a minimum average value of blinking over a predetermined length of time and obtaining an intermediate value therefrom as the reference value.

2. The auxiliary input device of claim 1, wherein the auxiliary input device is attached to an eyeglass frame, and the first and second infrared ray transmitters and the first and second reflected light sensors are mounted on a first and second eyeglass temple, respectively.

3. A computer input system comprising:
   a computer; and
   an auxiliary input device which transmits Morse code character strings as user input to the computer, wherein the user input corresponds to keyboard and mouse input,
   wherein the auxiliary input device includes:
      a first infrared ray transmitter;
      a first reflected light sensor;
      a second infrared ray transmitter;
      a second reflected light sensor; and
      a controller, wherein the first infrared ray transmitter transmits infrared rays towards one eyeball of a user and the first reflected light sensor senses the infrared rays reflected from the one eyeball and generates a first input;

wherein the second infrared ray transmitter transmits infrared rays towards the other eyeball of the user and the second reflected light sensor senses the infrared rays reflected from the other eyeball and generates a second input;

wherein the controller receives the first input and the second input, detects a change in the amount of light reflected from each of the eyeballs based on the first and second input, generates Morse code based on the detected change, and converts the Morse code into a character string; and wherein each of the first and second reflected light sensors initially set a reference value by obtaining a maximum average value and a minimum average value of blinking over a predetermined length of time and obtaining an intermediate value therefrom as the reference value.

4. The computer input system of claim 3, wherein the auxiliary input device is attached to an eyeglass frame, and the first and second infrared ray transmitters and the first and second reflected light sensors are mounted on a first and second eyeglass temple, respectively.

* * * * *